US010608147B2

(12) United States Patent
Naka

(10) Patent No.: US 10,608,147 B2
(45) Date of Patent: Mar. 31, 2020

(54) PACKAGE AND LIGHT-EMITTING DEVICE

(71) Applicant: NICHIA CORPORATION, Anan-shi (JP)

(72) Inventor: Ryoji Naka, Tokushima (JP)

(73) Assignee: NICHIA CORPORATION, Anan-shi (JP)

(*) Notice: Subject to any disclaimer, the term of this patent is extended or adjusted under 35 U.S.C. 154(b) by 0 days.

(21) Appl. No.: 16/181,346

(22) Filed: Nov. 6, 2018

(65) Prior Publication Data
US 2019/0088826 A1 Mar. 21, 2019

Related U.S. Application Data

(62) Division of application No. 14/845,270, filed on Sep. 4, 2015, now Pat. No. 10,153,403.

(30) Foreign Application Priority Data

Sep. 4, 2014 (JP) .................................. 2014-180087

(51) Int. Cl.
H01L 33/48 (2010.01)

(52) U.S. Cl.
CPC .. *H01L 33/486* (2013.01); *H01L 2224/45144* (2013.01); *H01L 2224/48091* (2013.01);
(Continued)

(58) Field of Classification Search
None
See application file for complete search history.

(56) References Cited

U.S. PATENT DOCUMENTS

2001/0022390 A1* 9/2001 Waitl ................. H01L 31/0203
257/666
2002/0123163 A1 9/2002 Fujii
(Continued)

FOREIGN PATENT DOCUMENTS

JP 09-051124 2/1997
JP 10-261821 9/1998
(Continued)

OTHER PUBLICATIONS

Japanese Office Action for corresponding JP Application No. 2014-180087, dated Mar. 6, 2018 (w/ machine translation).
(Continued)

*Primary Examiner* — Steven B Gauthier
(74) *Attorney, Agent, or Firm* — Mori & Ward, LLP

(57) ABSTRACT

A package includes a resin molded body having a side wall provided between a first side and a second side to surround a recess portion which has a bottom portion on the second side. The bottom portion of the recess portion includes an element mount region provided in a vicinity of the side wall and a wire connection region separated from the element mount region. The element mount region has a polygonal outer peripheral shape having corners and diagonals connecting two of the corners when viewed in the height direction. An area of the wire connection region is smaller than an area of the element mount region when viewed in the height direction. The wire connection region is provided on an extension of one of the diagonals passing through one of the corners of the element mount region to face toward the adjacent to one of the corners.

16 Claims, 2 Drawing Sheets

(52) U.S. Cl.
CPC  *H01L 2224/48247* (2013.01); *H01L 2924/00* (2013.01); *H01L 2924/00012* (2013.01); *H01L 2924/00014* (2013.01); *H01L 2924/10155* (2013.01); *H01L 2924/181* (2013.01)

(56) References Cited

U.S. PATENT DOCUMENTS

| | | | | |
|---|---|---|---|---|
| 2005/0127816 | A1* | 6/2005 | Sumitani | H01L 25/0753 313/498 |
| 2006/0043879 | A1* | 3/2006 | Naitou | C09K 11/0883 313/501 |
| 2007/0013304 | A1 | 1/2007 | Kaneko et al. | |
| 2009/0129085 | A1 | 5/2009 | Aizar et al. | |
| 2010/0148211 | A1 | 6/2010 | Sheu et al. | |
| 2012/0326175 | A1 | 12/2012 | Hu et al. | |
| 2013/0043501 | A1 | 2/2013 | Kobayakawa et al. | |
| 2014/0042471 | A1 | 2/2014 | Toyama et al. | |
| 2014/0070259 | A1 | 3/2014 | Yoon et al. | |
| 2014/0197438 | A1 | 7/2014 | Oh et al. | |
| 2014/0203304 | A1 | 7/2014 | Kim et al. | |
| 2016/0013373 | A1* | 1/2016 | Bhat | H01L 33/54 257/98 |

FOREIGN PATENT DOCUMENTS

| | | |
|---|---|---|
| JP | 2001-024228 | 1/2001 |
| JP | 2002-520823 | 7/2002 |
| JP | 2006-324317 | 11/2006 |
| JP | 2007-027431 | 2/2007 |
| JP | 2007-201028 | 8/2007 |
| JP | 2008-218764 | 9/2008 |
| JP | 2009-188069 | 8/2009 |
| JP | 2010-062427 | 3/2010 |
| JP | 2010-153861 | 7/2010 |
| JP | 2011-233800 | 11/2011 |
| JP | 2012-195430 | 10/2012 |
| JP | 2013-179271 | 9/2013 |
| JP | 2014-057060 | 3/2014 |
| JP | 2014-135489 | 7/2014 |
| KR | 10-2008-0088201 | 10/2008 |

OTHER PUBLICATIONS

Office Action with Form PTO-892 Notice of References Cited issued by the U.S. Patent and Trademark Office for the parent U.S. Appl. No. 14/845,270, dated Jul. 5, 2016.

Office Action with Form PTO-892 Notice of References Cited issued by the U.S. Patent and Trademark Office for the parent U.S. Appl. No. 14/845,270, dated Nov. 1, 2016.

Office Action with Form PTO-892 Notice of References Cited issued by the U.S. Patent and Trademark Office for the parent U.S. Appl. No. 14/845,270, dated Sep. 12, 2017.

Office Action with Form PTO-892 Notice of References Cited issued by the U.S. Patent Trademark Office for the parent U.S. Appl. No. 14/845,270, dated Nov. 30, 2017.

Office Action with Form PTO-892 Notice of References Cited issued by the U.S. Patent and Trademark Office for the parent U.S. Appl. No. 14/845,270, dated Jun. 14, 2018.

Notice of Allowance issued by the United States Patent and Trademark Office for the parent U.S. Appl. No. 14/845,270, dated Sep. 21, 2018.

* cited by examiner

PACKAGE AND LIGHT-EMITTING DEVICE

CROSS-REFERENCE TO RELATED APPLICATIONS

The present application is a divisional application of the U.S. patent application Ser. No. 14/845,270 filed on Sep. 4, 2015, which claims priority under 35 U. S. C. § 119 to Japanese Patent Application No. 2014-180087, filed Sep. 4, 2014. The contents of these applications are incorporated herein by reference in their entirety.

BACKGROUND

Technical Field

The present disclosure relates to a package and a light-emitting device.

Discussion of the Background

Conventionally, as a package for a light-emitting diode (LED), for example, package structures described in Japanese Unexamined Patent Application Publications No. 2010-153861 and No. 2006-324317 have been suggested.

SUMMARY OF THE INVENTION

According to one aspect of the present invention, a package includes a resin molded body, a first lead electrode, and a second lead electrode. The resin molded body has a first side, a second side opposite to the first side in a height direction of the resin molded body, and a side wall provided between the first side and the second side to surround a recess portion which has a bottom portion on the second side and an opening on the first side and in which a light-emitting element is to be provided. The first lead electrode is provided on the second side of the resin molded body. The second lead electrode is provided on the second side of the resin molded body. The bottom portion of the recess portion includes an element mount region and a wire connection region. An upper surface of the first lead electrode is exposed from the resin molded body in the element mount region and the element mount region has a polygonal outer peripheral shape having corners and diagonals connecting two of the corners when viewed in the height direction. The element mount region is provided in a vicinity of the side wall. An upper surface of the second lead electrode is exposed from the resin molded body in the wire connection region. The wire connection region is separated from the element mount region. An area of the wire connection region is smaller than an area of the element mount region when viewed in the height direction. The wire connection region is provided on an extension of one of the diagonals passing through one of the corners of the element mount region to face toward the adjacent to one of the corners.

According to another aspect of the present invention, a light-emitting device includes the package, the light-emitting element. The light-emitting element is mounted on the element mount region in the recess portion.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE EMBODIMENTS

Figure 1A:
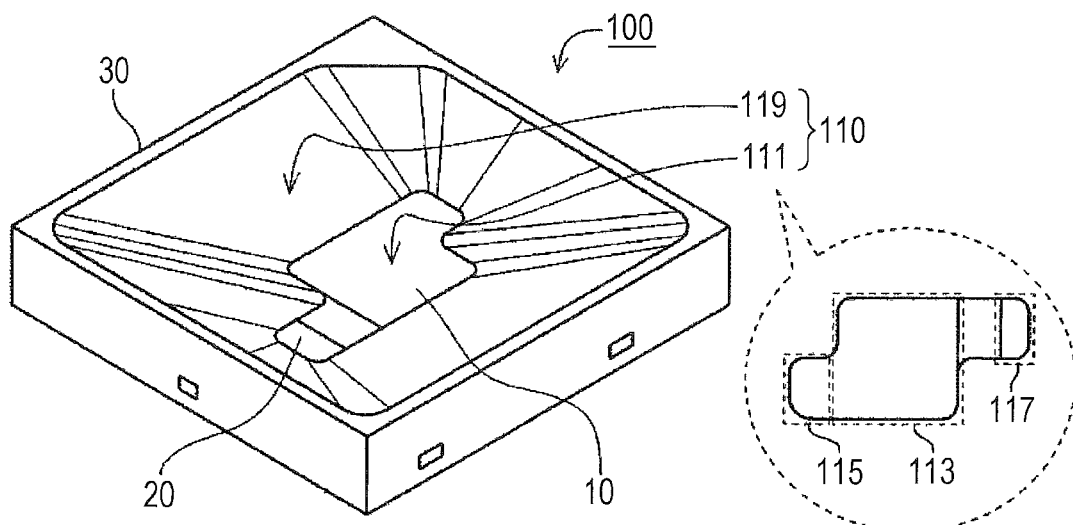
FIG. 1A illustrates a schematic perspective view of a package according to an embodiment of the present invention.

The embodiments will now be described with reference to the accompanying drawings, wherein like reference numerals designate corresponding or identical elements throughout the various drawings.

Hereinafter, embodiments of the invention will be described with reference to the drawings as appropriate. However, the package and the light-emitting device described below are for embodying the technical idea of the present disclosure, and unless otherwise noted, the present invention is not limited to the below description. In addition, the description in an embodiment and an example can be applied to other embodiments and examples. Further, sizes, positional relationships and the like of the members illustrated in each of the drawings may be exaggerated for clearer explanation.

First Embodiment

Figure 1B:
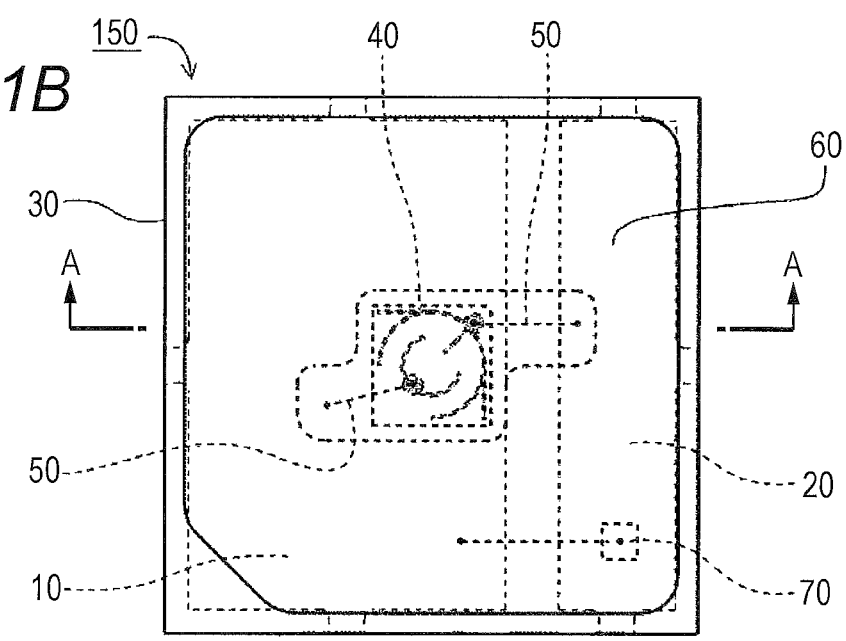
FIG. 1B illustrates a schematic top view of a light-emitting device according to an embodiment of the present invention.
Figure 1C:
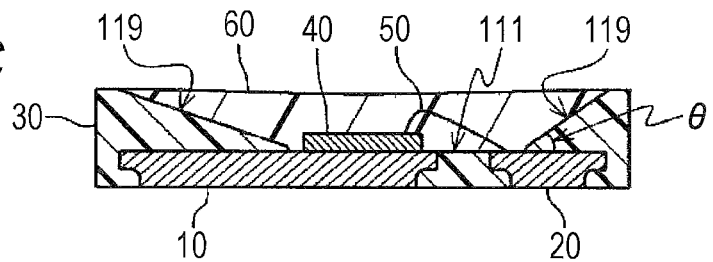
FIG. 1C is a schematic cross-sectional view illustrating a cross-section that is taken along a line A-A in FIG. 1B.

FIG. 1A illustrates a schematic perspective view of a package according to a first embodiment. FIG. 1B illustrates a schematic top view of a light-emitting device according to the first embodiment, and FIG. 1C is a schematic cross-sectional view illustrating a cross-section that is taken along a line A-A in FIG. 1B.

As shown in FIG. 1A, a package 100 according to the first embodiment is a package for an LED whose outer shape is a foursquare in top view. The package 100 includes a first lead electrode 10, a second lead electrode 20 and a resin molded body 30. The resin molded body 30 is molded integrally with the first lead electrode 10 and the second lead electrode 20. The package 100 has a recess portion 110 in which a light-emitting element is stored.

The recess portion 110 is constituted by a bottom portion 111 and a side wall 119. The bottom portion 111 includes an element mount region 113 and a wire connection region (a first wire connection region) 117. The element mount region 113 is a region where an upper surface of the first lead electrode 10 is exposed from the resin molded body 30. The wire connection region 117 is a region where an upper surface of the second lead electrode 20 is exposed from the resin molded body 30. The element mount region 113 has a top-view shape which is substantially along an outer shape of the light-emitting element. The wire connection region 117 is adjacent to the element mount region 113, and is smaller than the element mount region 113. Further, a surface of the side wall 119 is inclined so that an opening diameter of the recess portion 110 may become larger toward an upward direction from the element mount region 113 and the wire connection region 117.

According to the package 100 having such a structure, in which an end of the side wall 119 (that is, a boundary of the side wall 119 with the bottom portion 111) is provided closely to the light-emitting element to be mounted, light emitted from the light-emitting element can be reflected by a surface of the side wall 119 directly so as to be deflected toward the opening of the recess portion 110 easily. Thus, the repeated light reflection by inner surfaces of the package 100 can be suppressed, so that the light from the light-emitting element can be extracted efficiently.

As shown in FIGS. 1B and 1C, a light-emitting device 150 according to the first embodiment includes the package 100, a light-emitting element 40, a wire 50 and a sealing member 60. The light-emitting element 40 is mounted on the element mount region 113 of the package 100. The wire 50 connects the wire connection region 117 of the package 100 and the light-emitting element 40. The recess portion 110 of the package 100 is filled with the sealing member 60, by which the light-emitting element 40 is sealed.

In other words, the package 100 includes: the resin molded body 30 having a first side and a second side opposite to the first side in a height direction (a thickness direction) of the resin molded body 30; the first lead electrode 10 provided on the second side of the resin molded body 30; the second lead electrode 20 provided on the second side of the resin molded body 30; and the recess portion 110 which is provided on the first side of the resin molded body 30 and in which the light-emitting element 40 is provided. The recess portion 110 includes a bottom portion, a top portion, and the side wall 119. The bottom portion includes: the element mount region 113 in which an upper surface of the first lead electrode 10 is exposed from the resin molded body 30 and which has an outer peripheral shape (a top-view shape) in accordance with an outer peripheral shape (an outer shape) of the light-emitting element 40 when viewed in the height direction; and the wire connection region 117 in which an upper surface of the second lead electrode 20 is exposed from the resin molded body 30, the wire connection region 117 being provided adjacent to the element mount region 113 and being smaller than the element mount region 113. The top portion is provided opposite to the bottom portion in the height direction. The side wall 119 is provided to connect the top portion and the bottom portion so that an area of a cross-section of the recess portion 110 with respect to the height direction decreases from the top portion to the bottom portion.

The light-emitting device 150 having such a structure can exert the above-described function of the package 100, so that the light from the light-emitting element 40 can be extracted efficiently.

Hereinafter, embodiments of the package 100 and the light-emitting device 150 will be described in detail.

As shown in FIGS. 1A to 1C, the element mount region 113 and the wire connection region 117 preferably constitute one consecutive planar region. Thereby, generation of burr can be suppressed while the resin molded body 30 is molded, so that the element mount region 113 and the wire connection region 117 can be easily formed with high shape accuracy. Further, the wire 50 can be connected to the wire connection region 117 easily.

As shown in FIGS. 1A and 1B, the top-view shape of the element mount region 113 is a round-cornered foursquare. Since many of the light-emitting elements are rectangular in top view, the top-view shape of the element mount region 113 is preferably a rectangle or a round-cornered rectangle. Thereby, the end of the side wall 119 can be provided closely to the light-emitting element 40 easily, and the light emitted from the light-emitting element 40 is likely to be reflected directly by the surface of the side wall 119. Incidentally, the sides of element mount region 113 is substantially parallel with the sides of an outer shape of the resin molded body 30 and the sides of the opening of the recess portion 110 in top view.

As shown in FIGS. 1A and 1B, the wire connection region 117 is preferably positioned so that a side thereof constituting its periphery and a side of the element mount region 113 constituting its periphery may be on substantially the same straight line in top view. Thereby, in the light of the molding of the resin molded body 30, the element mount region 113 and the wire connection region 117 can be formed easily. Moreover, in case where at least one of a pair of positive and negative electrodes (pad electrodes) is arranged near the corner of the light-emitting element 40 which is rectangular in top view, the wire 50 can be formed easily in accordance with such arrangement.

As shown in FIGS. 1A and 1B, a shape of the opening of the recess portion 110 is a round-cornered rectangle which is substantially along the outer shape of the resin molded body 30 in top view. In case where outer shape of the package is rectangular in top view, the shape of the opening of the recess portion 110 is preferably a rectangle or a round-cornered rectangle, which is substantially along the outer shape of the resin molded body 30 in top view. Thereby, the opening of the recess portion 110 can be easily provided to be large, and the light emitted from the light-emitting element 40 can be easily extracted efficiently. Incidentally, a notch for polarity identification (see a left lower part of the package in FIG. 1B) is not considered as the shape of the opening of the recess portion 110.

As shown in FIGS. 1A and 1B, an area of the element mount region 113 is 1.67 times of an area of the light-emitting element 40 (a length of the side of the element mount region 113 is about 1.3 times of a length of a side of the light-emitting element 40) in designed value (in top view). As described above, the area of the element mount region 113 is preferably twice or less, more preferably 1.5 times or less, and still more preferably 1.2 times or less of the area of the light-emitting element 40. If the element mount region 113 has such a size, the end of the side wall 119 can be easily provided closely to the light-emitting element 40, and the light emitted from the light-emitting element 40 is likely to be reflected by the surface of the side wall 119 directly. A lower limit of the area of the element mount region 113 is not limited particularly as long as the light-emitting element 40 can be fixed on the element mount region 113, but is preferably larger than (one time of) the area of the light-emitting element 40. Further, an adhesive for sticking the light-emitting element 40 is preferably spaced from the side wall 119, but may coat a part of the surface of the side wall 119, if the adhesive is translucent.

As shown in FIGS. 1A and 1C, an inclination angle θ of the surface of the side wall 119 (the inclination angle θ is assumed to be an angle inside the resin molded body 30 with respect to the upper surface of the lead electrode) varies depending on a structure (a shape and an arrangement) of the bottom portion 111. Thus, the surface of the side wall 119 is constituted by plural surfaces. The some inclination angles θ of the plural surfaces of the side wall 119 are respectively different. The inclination angle θ of the surface of the side wall 119 is not limited particularly, but in the light of the light extraction efficiency, a smaller angle is more preferable as long as a predetermined depth of the recess portion 110 can be secured. More specifically, the inclination angle θ is, for example, more than 0° and 45° or less, preferably 5° or more and 40° or less, and more preferably 5° or more and 35° or less. Incidentally, in the case where the surface of the side wall 119 is curved as that of a below-described second embodiment, the inclination angle θ is assumed to be considered using a tangent plane of the surface or a tangent line of a cross section of the side wall 119.

As shown in FIG. 1C, the sealing member 60 preferably does not contain phosphor substantially. Thereby, the surface of the side wall 119 can be utilized most efficiently as the reflection surface without being coated with phosphor, and the light emitted from the light-emitting element 40 is likely to be reflected by the surface of the side wall 119 directly.

As shown in FIG. 1B, the package 100 may be provided with a protective element 70. This protective element 70 is embedded in the resin molded body 30, more specifically, in the resin molded body 30 that structures the side wall 119. Thereby, the light incidence into the protective element 70 and light absorption caused by the light incidence can be suppressed or prevented. In the package 100, the inclination angle θ of the surface of the side wall 119 is comparatively small, and thereby, an occupancy ratio of surface area of the side wall 119 in the recess portion 110 is comparatively high, so that the protective element 70 can be easily embedded in the resin molded body 30.

Incidentally, as shown in FIGS. 1A and 1B, in the package 100, the bottom portion 111 includes a second wire connection region 115. The second wire connection region 115 is a region where the upper surface of the first lead electrode 10 is exposed from the resin molded body 30, the region being different from the element mount region 113. That is, the bottom portion 111 of the package 100 includes: the element mount region 113; the first wire connection region 117; a spaced region between the first lead electrode 10 and the second lead electrode 20; and the second wire connection region 115. Further, in the present embodiment, these regions are consecutive so as to constitute one planar region. The second wire connection region 115 is preferably positioned substantially symmetrical to the first wire connection region 117 with respect to the element mount region 113, for example.

In addition, the description of "is smaller than the element mount region 113" regarding the wire connection region 117 (the second wire connection region 115 is also the same) means that the area thereof is smaller than the area of the element mount region 113 in top view, and its degree is not limited particularly. However, in the case where a direction in which the first lead electrode 10 and the second lead electrode 20 are arranged is assumed as a lateral direction, and a direction that is perpendicular to the lateral direction is assumed as a vertical direction in top view, a length (a width) of the wire connection region 117 at least in the vertical direction is preferably less than that of the element mount region 113. Further, it is more preferable that a length (a width) of the wire connection region 117 in the lateral direction is also less than that of the element mount region 113.

Second Embodiment

Figure 2A:
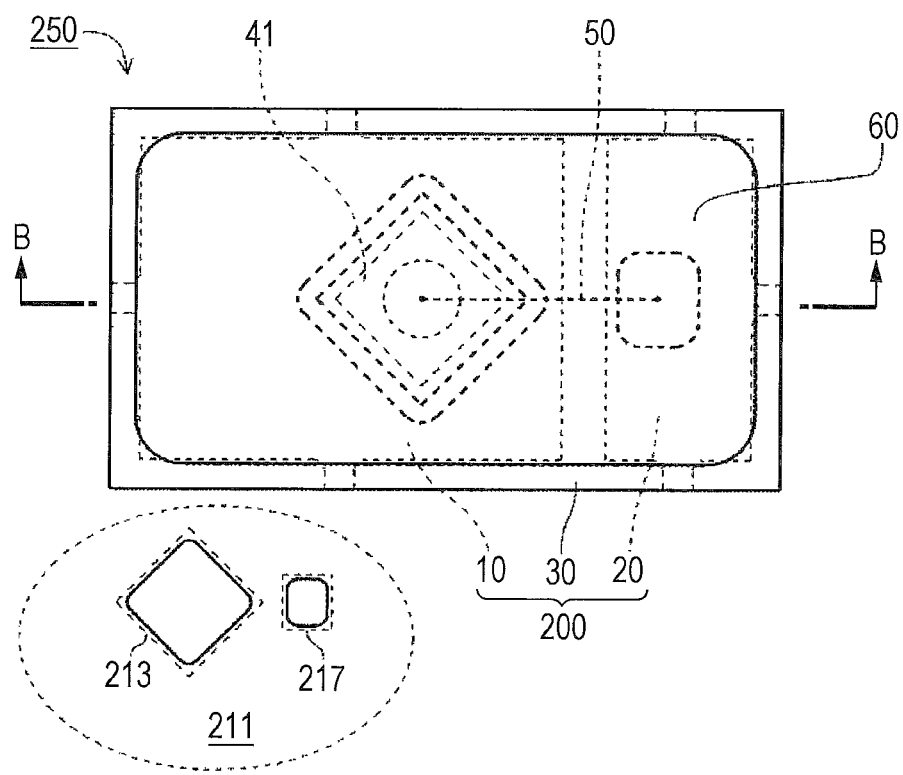
FIG. 2A illustrates a schematic top view of a light-emitting device according to an embodiment of the present invention.
Figure 2B:
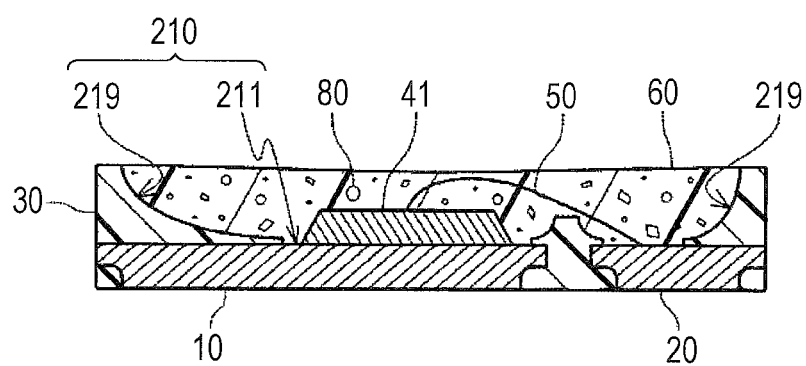
FIG. 2B is a schematic cross-sectional view illustrating a cross-section that is taken along a line B-B in FIG. 2A.

FIG. 2A illustrates a schematic top view of a light-emitting device according to the second embodiment, and FIG. 2B is a schematic cross-sectional view illustrating a cross-section that is taken along a line B-B in FIG. 2A.

As shown in FIGS. 2A and 2B, a package 200 according to the second embodiment is a package for an LED whose outer shape is a rectangle that is longer in the lateral direction in top view. The package 200 includes a first lead electrode 10, a second lead electrode 20 and a resin molded body 30. The resin molded body 30 is molded integrally with the first lead electrode 10 and the second lead electrode 20. The package 200 has a recess portion 210 in which a light-emitting element is stored. The recess portion 210 is constituted by a bottom portion 211 and a side wall 219. The bottom portion 211 includes an element mount region 213 and a wire connection region 217. The element mount region 213 is a region where an upper surface of the first lead electrode 10 is exposed from the resin molded body 30. The wire connection region 217 is a region where an upper surface of the second lead electrode 20 is exposed from the resin molded body 30. The element mount region 213 has a top-view shape which is substantially along an outer shape of the light-emitting element (a foursquare in the present example). The wire connection region 217 is adjacent to the element mount region 213, and is smaller than the element mount region 213. Further, a surface of the side wall 219 is curved so that an opening diameter of the recess portion 210 may become larger toward an upward direction from the element mount region 213 and the wire connection region 217.

A light-emitting device 250 according to the second embodiment includes the package 200, a light-emitting element 41, a wire 50 and a sealing member 60. The light-emitting element 41 is mounted on the element mount region 213 of the package 200. The wire 50 connects the wire connection region 217 of the package 200 and the light-emitting element 41. The recess portion 210 of the package 200 is filled with the sealing member 60, by which the light-emitting element 41 is sealed.

The package 200 and the light-emitting device 250 having such structures can also suppress the repeated light reflection by inner surfaces of the package 200, so that the light from the light-emitting element 41 can be extracted efficiently.

Hereinafter, embodiments of the package 200 and the light-emitting device 250 will be described.

As shown in FIGS. 2A and 2B, the element mount region 213 and the wire connection region 217 are preferably separated by a protrusion of the resin molded body 30. Thereby, the light emitted from the light-emitting element 41 can be reflected by this protrusion of the resin molded body 30, so that light incidence into the wire 50 (in particular, into a vicinity of a part connected with the wire connection region 217) and light absorption caused by the light incidence can be suppressed. Incidentally, this protrusion of the resin molded body 30 is provided on a spaced region between the first lead electrode 10 and the second lead electrode 20 in the present embodiment, but may be provided unevenly on the first lead electrode 10 or on the second lead electrode 20.

As shown in FIG. 2A, the wire connection region 217 is preferably positioned on an extended line of a diagonal line of the element mount region 213, adjacently to a corner of the element mount region 213 in top view. Thereby, a ratio that an end of the side wall 219 is positioned on a border of the element mount region 213 can be increased comparatively, so that the light emitted from the light-emitting element 41 is likely to be reflected by the surface of the side wall 219 directly. Moreover, in the case of the light-emitting element 41 having a rectangular shape in top view, in which at least one of a pair of positive and negative electrodes (pad electrodes) is arranged near the corner, the wire 50 can be formed easily in accordance with such arrangement. Incidentally, the element mount region 213 is slanted (rotated by about 45° in the present embodiment) with respect to the outer shape of the resin molded body 30 and the opening of the recess portion 210 in top view.

As shown in FIG. 2B, the light-emitting element 41 has a shape that its upper surface (a substrate surface) (on a substrate side) is smaller than its lower surface (an element structure surface) (on an element structure side) and its side surface is inclined. Thus, light-emitting intensity of the light-emitting element 41 is higher in a slanted direction than in a direction right above the light-emitting element 41. Then, the light-emitting device 250 has a structure that facilitates to extract the light that is thus emitted in the slanted direction from the light-emitting element 41 by reflecting the light by the surface of the side wall 219 directly.

As shown in FIG. 2B, the sealing member 60 includes phosphor 80. Then, the phosphor 80 is dispersed substantially entirely in the sealing member 60. Thereby, coating of the phosphor 80 on the surface of the side wall 219 can be reduced, and the surface of the side wall 219 can be utilized as a reflection surface comparatively easily. Therefore, even in the case where the sealing member 60 includes the phosphor 80, the light emitted from the light-emitting element 41 can be reflected directly by the surface of the side wall 219 comparatively easily.

Besides, also by distributing the phosphor 80 unevenly near the light-emitting element 41 in the sealing member 60 or by allowing the light-emitting element 41 itself to hold the phosphor 80, the coating of the phosphor 80 on the surface of the side wall 219 can be reduced, and the surface of the side wall 219 can be utilized as the reflection surface easily.

As stated above, the top-view (top surface light-emitting) type package has been described as the embodiments, but a structure of an external connection terminal is not limited particularly and a side-view (side surface light-emitting) type package can also be adopted, as long as the package is provided with the first and second lead electrodes and the resin molded body, and also has the recess portion in which the light-emitting element is stored.

Hereinafter, the respective constituents of the package and the light-emitting device of the embodiment of the present invention will be described.

First Lead Electrode 10 and Second Lead Electrode 20

For the lead electrodes, metal members that can electrically conduct when being connected with the light-emitting element can be used. More specifically, copper, aluminum, gold, silver, tungsten, iron, nickel, cobalt, molybdenum, alloy of them, phosphor bronze, copper-iron alloy and the like are exemplified. Shapes of the lead electrodes can be formed by processing board materials of the above-described metal by pressing, rolling, etching or the like. Moreover, on a surface layer of the lead electrode, a light reflective layer of silver, aluminum, rhodium, gold, copper, alloy of them or the like may be provided by plating or the like, and among them, silver that has the best light reflectivity is preferably used.

Resin Molded Body 30

The resin molded body has preferably light reflectivity. Thus, the resin molded body is preferably colored white. As a base material of the resin molded body, a thermosetting resin or a thermoplastic resin can be used. As the thermosetting resin, an epoxy resin, a modified epoxy resin, a silicone resin, a modified silicone resin, a polybismaleimide triazine resin, a polyimide resin, a polyurethane resin and the like are exemplified. Among them, any one of an epoxy resin, a modified epoxy resin, a silicone resin and a modified silicone resin is preferably used. As the thermoplastic resin, an aliphatic polyamide resin, a semi-aromatic polyamide resin, a polyethylene terephthalate, a polycyclohexane terephthalate, a liquid crystal polymer, a polycarbonate resin, syndiotactic polystyrene, polyphenylene ether, polyphenylene sulfide, a polyether sulfone resin, a polyether ketone resin, a polyarylate resin and the like are exemplified. Among them, an aliphatic polyamide resin or polycyclohexane terephthalate is preferably used. Further, in these base materials, particles or fibers of glass, silica, titanium oxide, magnesium oxide, magnesium carbonate, magnesium hydroxide, calcium carbonate, calcium hydroxide, calcium silicate, magnesium silicate, wollastonite, mica, zinc oxide, barium titanate, potassium titanate, aluminum borate, aluminum oxide, zinc oxide, silicon carbide, antimony oxide, zinc stannate, zinc borate, iron oxide, chromium oxide, manganese oxide, carbon black or the like can be mixed as a filler or a coloring pigment. Among them, silica as the filler and titanium oxide or zinc oxide as the coloring pigment (a reflecting member) are preferably used.

Light-Emitting Elements 40 and 41

As the light-emitting element, a semiconductor light-emitting element such as a light-emitting diode element can be used. The light-emitting element may have: an element structure that is composed of various kinds of semiconductors; and a pair of positive and negative electrodes. In particular, a light-emitting element of a nitride semiconductor ($In_xAl_yGa_{1-x-y}N$, $0 \leq x$, $0 \leq y$, $x+y \leq 1$) which can emit light from ultraviolet light to light in visible range is preferably used. In addition, a light-emitting element of a gallium arsenide-based or gallium phosphide-based semiconductor which emits light in green to red may be used. Many of the light-emitting elements have substrates. The substrate is preferably translucent, but is not limited to this. As a base material of the substrate, sapphire, spinel, gallium nitride, aluminum nitride, silicon, silicon carbide, gallium arsenide, gallium phosphide, indium phosphide, zinc sulfide, zinc oxide, zinc selenide and the like are exemplified. In the case of the light-emitting element in which the pair of the positive and negative electrodes are provided on the same surface side, the electrodes are connected with the lead electrodes respectively by wires, and are packaged in a face-up manner. In the case of the light-emitting element with a counter electrode structure in which the pair of the positive and negative electrodes are provided respectively on opposing surfaces sides, a lower surface electrode adheres to the lead electrode with an electrical conductive adhesive, and an upper surface electrode is connected with the lead electrode by a wire. The number of the light-emitting elements to be mounted on one package may be one or plural. The plural light-emitting elements can be connected in series or in parallel by the wires. Moreover, for example, three light-emitting elements which respectively emit light in blue, green and red may be mounted on one package.

Wire 50

The wire is a conducting wire that connects the electrode of the light-emitting element with the lead electrode. More specifically, a metal wire of gold, copper, silver, platinum, aluminum or alloy of them can be used. In particular, a gold wire which is not likely to be broken by stress from the sealing member and has good thermal resistance and the like is preferably used. Also, in order to enhance the light reflectivity, at least a surface of the wire may be made of silver.

Sealing Member 60

The sealing member is a member for sealing the light-emitting element, the wire and the like so as to protect them from dust, moisture, external force and the like. A base material of the sealing member may have an electrical insulation property, and may be able to transmit light which is emitted from the light-emitting element and/or the phosphor (preferably at a transmittance of 70% or more). More specifically, a silicone resin, an epoxy resin, a phenol resin, a polycarbonate resin, an acrylic resin, a TPX resin, a polynorbornene resin, modified resins of them and a hybrid resin containing one kind or more of these resins are exemplified. Among them, a silicone resin and its modified resin are preferable, because they have excellent heat resistance and light resistance, and their volumetric shrinkage after solidification is small. Further, in the sealing member, particles having various functions such as a filler and a phosphor may be mixed in its base material. As the filler, a diffusing agent, a coloring agent or the like can be used. More specifically, silica, titanium oxide, magnesium oxide, magnesium carbonate, magnesium hydroxide, calcium carbonate, calcium hydroxide, calcium silicate, zinc oxide, barium titanate, aluminum oxide, iron oxide, chromium oxide, manganese oxide, glass, carbon black and the like are exemplified.

Protective Element 70

The protective element is an element for protecting the light-emitting element from static electricity and a high-voltage surge. More specifically, a Zener diode is exemplified.

Phosphor 80

The phosphor absorbs at least part of the primary light that is emitted from the light-emitting element, and emits secondary light at a wavelength which is different from that of the primary light. More specifically, yttrium-aluminum-garnet activated with cerium, nitrogen-containing calcium aluminosilicate activated with europium and/or chromium, sialon activated with europium, silicate activated with europium, potassium fluorosilicate activated with manganese and the like are exemplified. Accordingly, a light-emitting device which emits mixed-color light (for example, white light) of primary light and secondary light at visible wavelengths, or a light-emitting device which emits secondary light at a visible wavelength by being excited with primary light that is ultraviolet light can be obtained.

Adhesive

The adhesive is a member for sticking the light-emitting element to the lead electrode. As an insulating adhesive, an epoxy resin, a silicone resin, a polyimide resin, modified resins of them, hybrid resins of them and the like can be used. As an electrical conductive adhesive, a conductive paste of silver, gold, palladium or the like, tin-bismuth-based, tin-copper-based, tin-silver-based or gold-tin-based solder or the like can be used.

EXAMPLES

Hereinafter, examples according to the embodiment of the present invention will be described in detail. Needless to say, the present invention is not limited only to the examples described below.

Example 1

A light-emitting device of Example 1 is a top-view SMD-type LED with an approximately rectangular parallelepiped shape, which has the structure of the light-emitting device 150 in the example illustrated in FIGS. 1B and 1C (excluding the protective element 70). Hereinafter, the explanation will be provided by specifying a length (in a vertical direction) and a width (in a lateral direction) in accordance with the directions of the package and the light-emitting device illustrated in FIG. 1B.

The package has a size of a length of 3.0 mm, a width of 3.0 mm and a thickness of 0.52 mm, which is structured by molding a resin molded body integrally with a pair of positive and negative (first and second) lead electrodes. This package is produced by: setting a processing metal board (a lead frame), which includes a plurality of sets of the lead electrodes arranged consecutively in rows and columns via suspension leads, into a mold; injecting a liquid constituent material of the resin molded body; solidifying the constituent material; releasing the constituent material with the lead frame from the mold; and subsequently cutting them (into individual chips).

Each of the first and second lead electrodes is a board-shaped small chip of copper alloy whose surface is subjected to silver plating and whose maximum thickness is 0.2 mm. An exposed region of a lower surface of each of the first and second electrodes constitutes substantially the same face as a lower surface of the resin molded body, which constitutes a lower surface of the package. In each of the first and second lead electrodes, the cut suspension lead portion is exposed from an end surface of the package (the resin molded body).

The resin molded body has an outer shape of a foursquare with a length of 3.0 mm and a width of 3.0 mm in top view, and has a maximum thickness of 0.52 mm, which is made of an epoxy resin that contains silica and titanium oxide. At a substantial center of an upper surface of the resin molded body, that is, an upper surface of the package, a recess portion, which has a round-cornered foursquare opening with a length of 2.6 mm and a width of 2.6 mm (excluding a notch for polarity identification) in top view, and whose depth is 0.32 mm, is formed.

The recess portion is constituted by a bottom portion and a side wall. An element mount region of the (round-cornered) bottom portion is in an exposed region of an upper surface of the first lead electrode (a position of the element mount region is at a center in the vertical direction, and at a right end in the lateral direction), and is an approximately foursquare region with a length of 840 μM and a width of 840 μm. A second wire connection region is in the exposed region of the upper surface of the first lead electrode (the second wire connection region is positioned continuously to the element mount region on its left side so that lower sides of the second wire connection region and the element mount region may be on the same straight line), and is a substantially rectangular region with a length of 420 μm and a width of 310 μm. A first wire connection region is in an exposed region of an upper surface of the second lead electrode (the first wire connection region is positioned, in the vertical direction, so that upper sides of the first wire connection region and the element mount region may be on the same straight line, and is positioned at a left end in the lateral direction), and is a substantially rectangular region with a length of 420 m and a width of 230 μm. Between the element mount region and the first wire connection region of the bottom portion, there is a spaced region of the first lead electrode and the second lead electrode, which is structured by a surface of the resin molded body. A surface of the side wall is structured by the resin molded body, and is inclined from a periphery of the bottom portion as a substantial starting point (an end). An inclination angle θ of the surface of the side wall ranges from 18° to 33°.

On the element mount region of the package, one light-emitting element adheres with an adhesive that is a dimethyl silicone resin. This light-emitting element is an LED element with a length of 650 pan, a width of 650 μm and a thickness of 150 m, in which an element structure of a nitride semiconductor is laminated on a sapphire substrate, and which can emit blue light (at a center wavelength of about 453 nm). Further, an n electrode of the light-emitting element is connected to the second wire connection region by a wire, and a p electrode of the light-emitting element is connected to the first wire connection region by a wire. The wires are gold wires with a wire diameter of 25 μm.

The recess portion of the package is filled with a sealing member, by which the light-emitting element is coated. The sealing member includes a phenyl silicone resin as a base material, in which a filler of silica is contained. An upper surface of the sealing member constitutes substantially the same face as the upper surface of the package, and is substantially a flat surface (in a precise sense, a slightly concave face due to cure shrinkage). This sealing member is formed by: dropping its liquid constituent material into the recess portion of the package with a dispenser or the like; and solidifying the constituent material by heat.

The light-emitting device of Example 1 which is structured as described above can emit light at a current of 65 mA and radiant flux ($\Phi_e$) of 117.1 mW. This value is higher, by as much as 8.7%, than 107.8 mW that is radiant flux ($\Phi_e$) of a light-emitting device which is produced similarly to the light-emitting device of Example 1 except for providing a recess portion having: an opening with the same top-view shape; and a surface of a side wall that is inclined uniformly at an inclination angle ($\theta$) of 63°.

A package of the embodiment of the present invention includes: a first lead electrode; a second lead electrode; and a resin molded body that is molded integrally with the first lead electrode and the second lead electrode, and has a recess portion in which a light-emitting element is to be stored, wherein the recess portion is constituted by a bottom portion and a side wall, the bottom portion includes: an element mount region in which an upper surface of the first lead electrode is exposed from the resin molded body; and a wire connection region in which an upper surface of the second lead electrode is exposed from the resin molded body, the element mount region has a top-view shape that is substantially along an outer shape of the light-emitting element, the wire connection region is adjacent to the element mount region and is smaller than the element mount region, and a surface of the side wall is inclined or curved so that an opening diameter of the recess portion becomes larger toward an upward direction from the element mount region and the wire connection region.

According to the embodiment of the present invention, repeated light reflection by inner surfaces of the package can be suppressed, so that the light from the light-emitting element can be extracted efficiently.

Obviously, numerous modifications and variations of the present invention are possible in light of the above teachings. It is therefore to be understood that within the scope of the appended claims, the invention may be practiced otherwise than as specifically described herein.

What is claimed is:

1. A package comprising:
   a resin molded body having a first side, a second side opposite to the first side in a height direction of the resin molded body, and a side wall provided between the first side and the second side to surround a recess portion which has a bottom portion on the second side and an opening on the first side and in which a light-emitting element is to be provided;
   a first lead electrode provided on the second side of the resin molded body;
   a second lead electrode provided on the second side of the resin molded body; and
   the bottom portion of the recess portion comprising:
     an element mount region in which an upper surface of the first lead electrode is exposed from the resin molded body and which has a polygonal outer peripheral shape having corners and diagonals connecting two of the corners when viewed in the height direction, the element mount region being provided in a vicinity of the side wall; and
     a wire connection region in which an upper surface of the second lead electrode is exposed from the resin molded body, the wire connection region being separated from the element mount region by a part of the resin molded body of which a height is higher than that of the upper surface of the first lead electrode, an area of the wire connection region being smaller than an area of the element mount region when viewed in the height direction, the wire connection region being provided on an extension of one of the diagonals passing through one of the corners of the element mount region to face toward the one of the corners,
   wherein a shape of the element mount region is a rectangle when viewed in the height direction.

2. The package according to claim 1,
   wherein an outer periphery of the resin molded body has substantially a rectangular shape having first rectangular sides when viewed in the height direction,
   wherein the opening has substantially a rectangular shape having second rectangular sides when viewed in the height direction,
   wherein the polygonal outer peripheral shape has third sides connecting corners, and
   wherein each of the third sides is non-parallel to each of the first rectangular sides and non-parallel to each of the second rectangular sides when viewed in the height direction.

3. A light-emitting device comprising:
   the package according to claim 1; and
   a light-emitting element mounted on the element mount region in the recess portion.

4. The light-emitting device according to claim 3,
   wherein the area of the element mount region is 1.5 times or less of an area of the light-emitting element.

5. The light-emitting device according to claim 3,
   wherein the light emitting element includes a substrate surface, an element structure surface opposite to the substrate surface in the height direction, and a light emitting element side surface connecting the substrate surface and the element structure surface,
   wherein the substrate surface is smaller than the element structure surface, wherein the light emitting element is mounted on the element mount region such that the element structure surface of the light emitting element faces the element mount region of the bottom portion and the light emitting element side surface is non-parallel to the height direction.

6. The light-emitting device according to claim 3, further comprising:
   a sealing member provided in the recess portion to seal the light-emitting element, the sealing member including phosphor dispersed in the sealing member.

7. The package according to claim 1,
wherein the element mount region is a region in which the upper surface of the first lead electrode is exposed from the side wall of the resin molded body, and
wherein the wire connection region is a region in which the upper surface of the second lead electrode is exposed from the side wall of the resin molded body.

8. A package comprising:
a resin molded body having a first side, a second side opposite to the first side in a height direction of the resin molded body, and a side wall provided between the first side and the second side to surround a recess portion which has a bottom portion on the second side and an opening on the first side and in which a light-emitting element is to be provided;
a first lead electrode provided on the second side of the resin molded body;
a second lead electrode provided on the second side of the resin molded body; and
the bottom portion of the recess portion comprising:
an element mount region in which an upper surface of the first lead electrode is exposed from the resin molded body and which has a polygonal outer peripheral shape having corners and diagonals connecting two of the corners when viewed in the height direction, the element mount region being provided in a vicinity of the side wall; and
a wire connection region in which an upper surface of the second lead electrode is exposed from the resin molded body, the wire connection region being separated from the element mount region by a part of the resin molded body of which a height is higher than that of the upper surface of the first lead electrode, an area of the wire connection region being smaller than an area of the element mount region when viewed in the height direction, the wire connection region being provided on an extension of one of the diagonals passing through one of the corners of the element mount region to face toward the one of the corners,
wherein a shape of the upper surface of the first lead which is exposed from the resin molded body is a rectangle when viewed in the height direction.

9. A package comprising:
a resin molded body having a first side, a second side opposite to the first side in a height direction of the resin molded body, and a side wall provided between the first side and the second side to surround a recess portion which has a bottom portion on the second side and an opening on the first side and in which a light-emitting element is to be provided;
a first lead electrode provided on the second side of the resin molded body;
a second lead electrode provided on the second side of the resin molded body; and
the bottom portion of the recess portion comprising:
an element mount region in which an upper surface of the first lead electrode is exposed from the resin molded body and which has a polygonal outer peripheral shape having corners and diagonals connecting two of the corners when viewed in the height direction, the element mount region being provided in a vicinity of the side wall; and
a wire connection region in which an upper surface of the second lead electrode is exposed from the resin molded body, the wire connection region being separated from the element mount region, an area of the wire connection region being smaller than an area of the element mount region when viewed in the height direction, the wire connection region being provided on an extension of one of the diagonals passing through one of the corners of the element mount region to face toward the one of the corners,
wherein a shape of the upper surface of the first lead which is exposed from the resin molded body is a rectangle when viewed in the height direction.

10. The package according to claim 9,
wherein an outer periphery of the resin molded body has substantially a rectangular shape having first rectangular sides when viewed in the height direction,
wherein the opening has substantially a rectangular shape having second rectangular sides when viewed in the height direction,
wherein the polygonal outer peripheral shape has third sides connecting corners, and
wherein each of the third sides is non-parallel to each of the first rectangular sides and non-parallel to each of the second rectangular sides when viewed in the height direction.

11. A light-emitting device comprising:
the package according to claim 9; and
a light-emitting element mounted on the element mount region in the recess portion.

12. The light-emitting device according to claim 11,
wherein the area of the element mount region is 1.5 times or less of an area of the light-emitting element.

13. The light-emitting device according to claim 11,
wherein the light emitting element includes a substrate surface, an element structure surface opposite to the substrate surface in the height direction, and a light emitting element side surface connecting the substrate surface and the element structure surface,
wherein the substrate surface is smaller than the element structure surface, wherein the light emitting element is mounted on the element mount region such that the element structure surface of the light emitting element faces the element mount region of the bottom portion and the light emitting element side surface is non-parallel to the height direction.

14. The light-emitting device according to claim 11, further comprising:
a sealing member provided in the recess portion to seal the light-emitting element, the sealing member including phosphor dispersed in the sealing member.

15. The light-emitting device according to claim 9,
wherein the wire connection region is separated from the element mount region by a part of the resin molded body of which a height is higher than that of the upper surface of the first lead electrode.

16. The package according to claim 9,
wherein the element mount region is a region in which the upper surface of the first lead electrode is exposed from the side wall of the resin molded body, and
wherein the wire connection region is a region in which the upper surface of the second lead electrode is exposed from the side wall of the resin molded body.

* * * * *